United States Patent
Yang et al.

(10) Patent No.: US 7,830,010 B2
(45) Date of Patent: Nov. 9, 2010

(54) SURFACE TREATMENT FOR SELECTIVE METAL CAP APPLICATIONS

(75) Inventors: Chih-Chao Yang, Glenmont, NY (US); Satya V. Nitta, Poughquag, NY (US); Sampath Purushothaman, Yorktown Heights, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 12/062,130

(22) Filed: Apr. 3, 2008

(65) Prior Publication Data

US 2009/0250815 A1    Oct. 8, 2009

(51) Int. Cl.
*H01L 23/48* (2006.01)
(52) U.S. Cl. .................. 257/751; 257/752; 257/759; 257/768; 257/E23.162; 257/E21.593; 438/650; 438/686
(58) Field of Classification Search ............... 257/751, 257/752, 759, 768, E23.162, E21.593; 438/650, 438/686
See application file for complete search history.

(56) References Cited

U.S. PATENT DOCUMENTS

| 5,585,673 | A | 12/1996 | Joshi et al. |
| 5,695,810 | A | 12/1997 | Dubin et al. |
| 6,323,554 | B1 | 11/2001 | Joshi et al. |
| 6,342,733 | B1 | 1/2002 | Hu et al. |
| 6,706,625 | B1 | 3/2004 | Sudijono et al. |
| 2004/0113279 | A1 | 6/2004 | Chen et al. |
| 2005/0230831 | A1* | 10/2005 | Clevenger et al. ........... 257/751 |
| 2008/0047583 | A1* | 2/2008 | Fukunaga et al. .............. 134/3 |
| 2008/0241499 | A1* | 10/2008 | Sinapi et al. ............. 428/304.4 |
| 2009/0014846 | A1* | 1/2009 | Fresco et al. ................. 257/642 |
| 2009/0189287 | A1* | 7/2009 | Yang et al. ................... 257/769 |

OTHER PUBLICATIONS

U.S. Appl. No. 12/021,316, entitled "Noble Metal Cap for Interconnect Structures," filed on Jan. 29, 2008, first named inventor: Chih-Chao Yang.

* cited by examiner

*Primary Examiner*—Tu-Tu V Ho
(74) *Attorney, Agent, or Firm*—Scully, Scott, Murphy & Presser, P.C.; Louis J. Percello, Esq.

(57) ABSTRACT

Interconnect structures in which a noble metal-containing cap layer is present directly on a non-recessed surface of a conductive material which is embedded within a low k dielectric material are provided. It has been determined that by forming a hydrophobic surface on a low k dielectric material prior to metal cap formation provides a means for controlling the selective formation of the metal cap directly on the non-recessed surface of a conductive material. That is, the selective formation of the metal cap directly on the non-recessed surface of a conductive material is enhanced since the formation rate of the metal cap on the non-recessed surface of a conductive material is greater than on the hydrophobic surface of the low k dielectric material. It is observed that the hydrophobic surface may be a result of treating a damaged surface of the dielectric material with a silylating agent prior to the selective formation of the noble metal cap or, as a result of forming a hydrophobic polymeric layer on the surface of the dielectric material prior to the selective deposition of the noble metal cap. The hydrophobic polymeric layer typically includes atoms of Si, C and O.

9 Claims, 8 Drawing Sheets

US 7,830,010 B2

SURFACE TREATMENT FOR SELECTIVE METAL CAP APPLICATIONS

RELATED APPLICATIONS

This application is related to co-pending and co-assigned U.S. application Ser. No. 12/021,316, filed Jan. 29, 2008.

FIELD OF THE INVENTION

The present invention relates to semiconductor interconnect structures, and methods of fabricating the same. More particularly, the present invention relates to semiconductor interconnect structures having enhanced electromigration (EM) reliability in which the selectivity of a noble metal cap to a surface of a conductive material that is embedded within a dielectric material is enhanced.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1C is at a time when the void 14 grows towards the bottom of the conductive feature 10, and FIG. 1D is at a time in which the void 14 growth crosses the metal interconnect feature 10 causing a circuit dead opening.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap extends onto the adjoining surface of the interconnect dielectric material and, as such, electrical shorts between adjacent interconnects may arise. This is seen, for example, in FIG. 2 wherein reference numeral 20 denotes a dielectric material, reference numeral 22 denotes a conductive material embedded within the dielectric material 20, reference numeral 24 denotes a Co-containing alloy metal cap, and reference numeral 25 denotes metal residues from the Co-containing alloy cap process.

In addition to the above, it is known to provide a metal cap directly on the surface of an interconnect conductive material, such as, for example, Cu, by recessing the interconnect conductive material below a surface of the interconnect dielectric material. Such a structure is shown, for example, in FIG. 3. In this figure, reference numeral 20 denotes the interconnect dielectric material, reference numeral 22 denotes the interconnect conductive material embedded within the dielectric material 20, reference numeral 23 denotes a dielectric cap, and reference numeral 24 denotes the metal cap. Although this prior art recess process provides a metal cap that is located only on a surface of the recessed conductive material, such a process is problematic since there is high process cost associated with such a process.

It is also worth mentioning that during a clean in dilute hydrofluoric acid, which is generally used to clean the surface of the interconnect dielectric material, corrosion of metal caps may occur. This is particularly observed when CoWP is used as the metal cap material.

In view of the above, there is a need for providing an interconnect structure which avoids a circuit dead opening caused by EM failure as well as electrical shorts between adjacent interconnect structures which are typically exhibited when prior art selectively deposited Co-containing metal caps are employed. There is also a need for providing a method in which the selectivity of the noble metal onto the surface of an embedded conductive material is enhanced.

SUMMARY OF THE INVENTION

The present invention provides circuit interconnect structures that have improved EM reliability. The present invention also provides interconnect structures in which electrical shorts between adjacent interconnect structures is avoided. The present invention also provides interconnect structures that have better reliability and technology extendibility for the semiconductor industry. The present invention also provides an interconnect structure in which the noble metal cap is selectively formed on a non-recessed surface of an embedded conductive material.

In particular, the present invention provides interconnect structures in which a noble metal-containing cap layer is present directly on a non-recessed surface of a conductive material which is embedded within a low k dielectric material. The term "low k" is used throughout this application to denote an interconnect dielectric material having a dielectric constant of about 3.0 or less. Applicants have determined that by forming a hydrophobic surface on a low k dielectric material prior to metal cap formation provides a means for controlling the selective formation of the metal cap directly on the non-recessed surface of a conductive material. That is, the selective formation of the metal cap directly on the non-recessed surface of a conductive material is enhanced since the formation rate of the metal cap on the non-recessed surface of a conductive material is greater than on the hydrophobic surface of the low k dielectric material. It is observed that the hydrophobic surface may be a result of treating a damaged surface of the dielectric material with a silylating agent prior to the selective formation of the noble metal cap or, as a result of forming a hydrophobic polymeric layer on the surface of the dielectric material prior to the selective deposition of the noble metal cap. The hydrophobic polymeric layer typically includes atoms of Si, C and O.

In general terms, the interconnect structure of the present invention comprises:

a dielectric material having a dielectric constant of about 3.0 or less, said dielectric material having a hydrophobic surface and at least one conductive material having an upper surface embedded within said dielectric material; and a noble metal cap located directly on said upper surface of said at least one conductive material, said noble metal cap does not substantially extend onto said hydrophobic surface and no noble metal residues are present on the hydrophobic surface.

The phrase "substantially does not extend" is used in the present invention to denote that no or minimal net noble metal noble metal is deposited on the low k dielectric material because of the presence of the hydrophobic surface on the dielectric material. The minimal extension of the noble metal cap onto the hydrophobic surface of the dielectric material is less than 5 Å. Also, there is no "residues" from the noble metal cap deposition on the hydrophobic surface layer of the dielectric material. By "residues" it is meant that no fragments of noble metal material form on the dielectric material surface.

In one embodiment of the present invention, the hydrophobic surface includes a silylating agent which is capable of converting pendent silanol groups present on the dielectric material into different functional groups which exhibit a reduction in moisture uptake. That is, the silylating agent caps off the pendant silanol groups present on the surface of the dielectric material.

In another embodiment of the invention, the hydrophobic surface is a hydrophobic polymeric layer that is deposited on the surface of the dielectric material prior to the selective deposition of the noble metal cap. The polymeric layer typically includes atoms of Si, C and O. One example of a polymeric layer that can be used as the hydrophobic surface includes a polysiloxane.

The dielectric material which is present in the inventive interconnect structure may be any interconnect dielectric material having a dielectric constant of about 3.0 or less. Illustratively, the dielectric material employed in the present invention comprises a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as AlCu).

The conductive material is typically separated from the dielectric material by a diffusion barrier. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

The term "noble metal" when referring to the cap located atop the at least one conductive material includes any metal that is resistant to corrosion or oxidation. The preferred noble metals that can be used in the present invention are selected from the group consisting of Ru, Ir, Rh, Pt and alloys thereof. More preferably, the noble metal employed as the noble metal cap comprises Ru or a Ru alloy.

In one embodiment of the present invention, the upper surface of the at least one conductive material is substantially coplanar with the hydrophobic surface of the interconnect dielectric material.

In another embodiment of the present invention, the upper surface of the at least one conductive material is at a height which is greater than the hydrophobic surface of the interconnect dielectric material.

In yet another embodiment of the present invention, the upper surface of the at least one conductive material is at a height which is less than the hydrophobic surface of the interconnect dielectric material.

In addition to the interconnect structures mentioned above, the present invention also provides methods of fabricating the same. With respect to the inventive methods, the applicants have determined that improved selectivity of noble metal deposition onto the conductive material instead of the dielectric material can be obtained if the dielectric material including the embedded conductive material includes a hydrophobic surface prior to the formation of the noble metal cap. The hydrophobic surface can be formed on the dielectric material by treating the dielectric material with a silylating agent or by forming a polymeric layer (typically comprising atoms of Si, C and O) on the surface of the dielectric material; the treating and forming occur prior to the formation of the noble metal cap.

In general terms, the inventive method includes:

providing a dielectric material having a dielectric constant of about 3.0 or less, said dielectric material having at least one conductive material having an upper surface embedded within said dielectric material;

forming a hydrophobic surface on exposed surfaces of the dielectric material; and forming a noble metal cap directly on said upper surface of said at least one conductive material, said noble metal cap does not substantially extend onto said hydrophobic surface and said noble metal cap forming does not result in noble metal residues on the hydrophobic surface.

In one embodiment of the invention, the hydrophobic surface may be a result of treating a damaged surface of the dielectric material with a silylating agent prior to the selective formation of the noble metal cap. In yet another embodiment of the invention, the hydrophobic surface may be a result of forming a hydrophobic polymeric layer on the surface of the dielectric material prior to the selective deposition of the noble metal cap.

DETAILED DESCRIPTION OF THE INVENTION

Figure 1A:
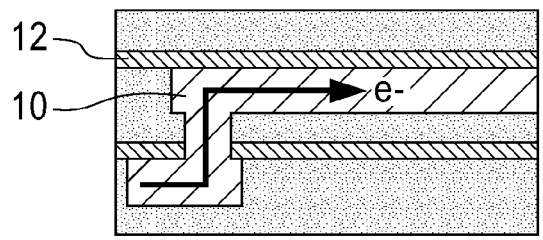
FIGS. 1A-1D are pictorial representations (through cross sectional views) illustrating the formation of a circuit dead opening in a prior art interconnect structure which is caused by EM failure.
Figure 1B:
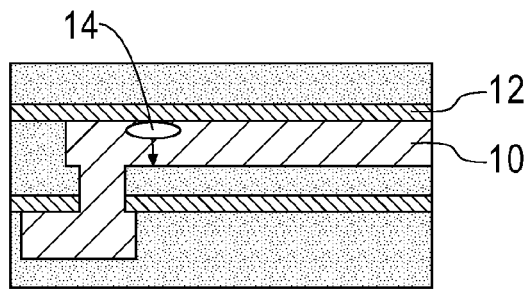
Figure 1C:
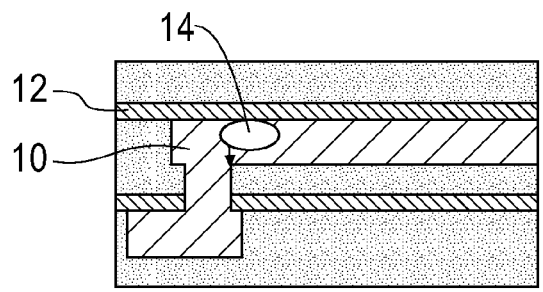
Figure 1D:
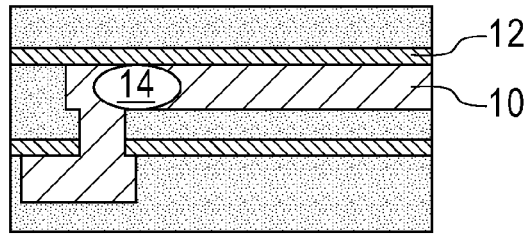
Figure 2:
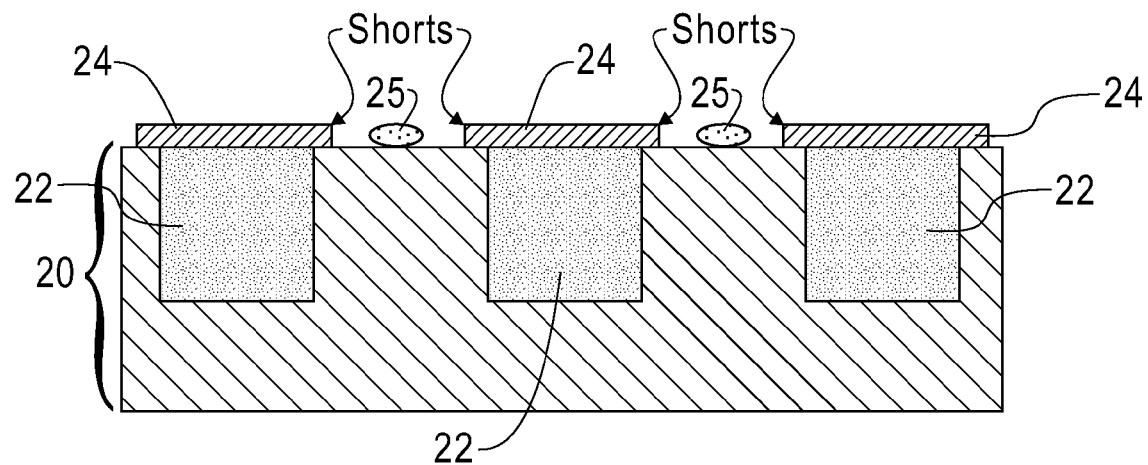
FIG. 2 is a prior art interconnect structure (through a cross sectional view) including a Co-containing alloy metal cap located atop a conductive material that is embedded with a dielectric material, and metal residues from the Co-containing alloy cap process are present on the dielectric surface.
Figure 3:
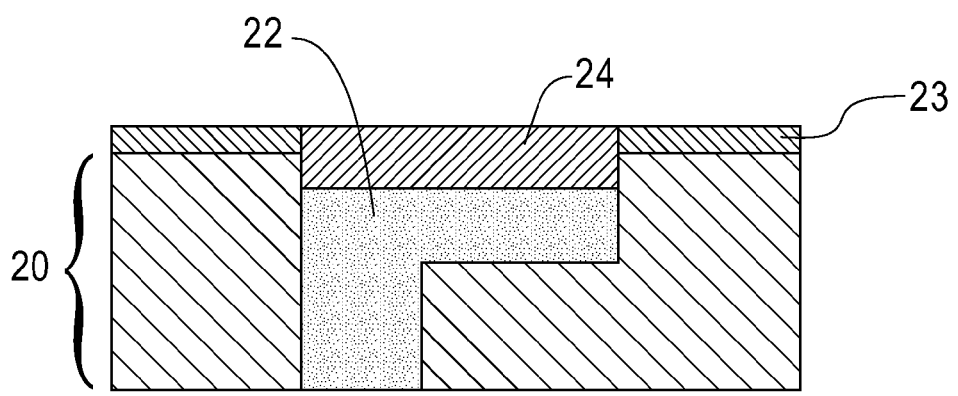
FIG. 3 is a pictorial representation of a prior art interconnect structure (through a cross sectional view) including a recessed conductive material embedded within a dielectric material.

The present invention, which provides interconnect structures having enhanced electromigration (EM) reliability without degrading circuit short yield and methods of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides interconnect structures that include a dielectric material having a dielectric constant of about 3.0 or less. This low k dielectric material has at least one conductive material having an upper surface embedded therein. The dielectric material also has a surface that is made hydrophobic prior to the formation of the noble metal cap. The noble metal cap is located directly on the upper surface of the at least one conductive material. Because of the presence of the hydrophobic surface on the dielectric material, the noble metal cap does not substantially extend onto the hydrophobic surface of the dielectric material that is adjacent to the at least one conductive material and no metal residues from the noble metal cap deposition form on this hydrophobic surface. It is observed that the hydrophobic surface may be a result of treating a damaged surface of the dielectric material with a silylating agent prior to the selective formation of the noble metal cap or a result of forming a hydrophobic polymeric layer on the surface of the dielectric material prior to the selective deposition of the noble metal cap.

The present invention also provides methods of fabricating such an interconnect structure in which exposed surfaces of a dielectric material including at least one conductive material embedded therein are made hydrophobic prior to the formation of the noble metal cap. In one embodiment of the invention, the hydrophobic surface is achieved by treating a planarized and damaged surface of a dielectric material with a silylating agent. Such a treatment occurs after formation of the at least one conductive material embedded within the dielectric material, but prior to the formation of the noble metal cap. This embodiment of the invention is illustrated in FIGS. 4A-4E and FIGS. 5A-5B. In another embodiment, the hydrophobic surface is provided by forming a hydrophobic polymeric layer, such as, for example, a polysiloxane, on the planarized and damaged surface of the dielectric material. Such an embodiment is illustrated in FIGS. 6A-6B and FIGS. 7A-7B.

Figure 4A:
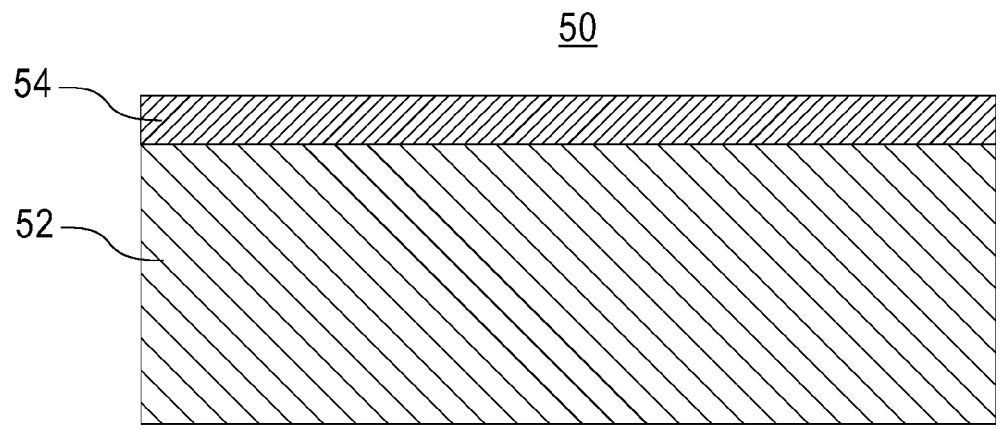
FIGS. 4A-4E illustrate an interconnect structure (through cross sectional views) with a noble metal cap and a non-recessed upper surface of a low k dielectric material during various processing steps of one embodiment of the present invention.
Figure 4B:
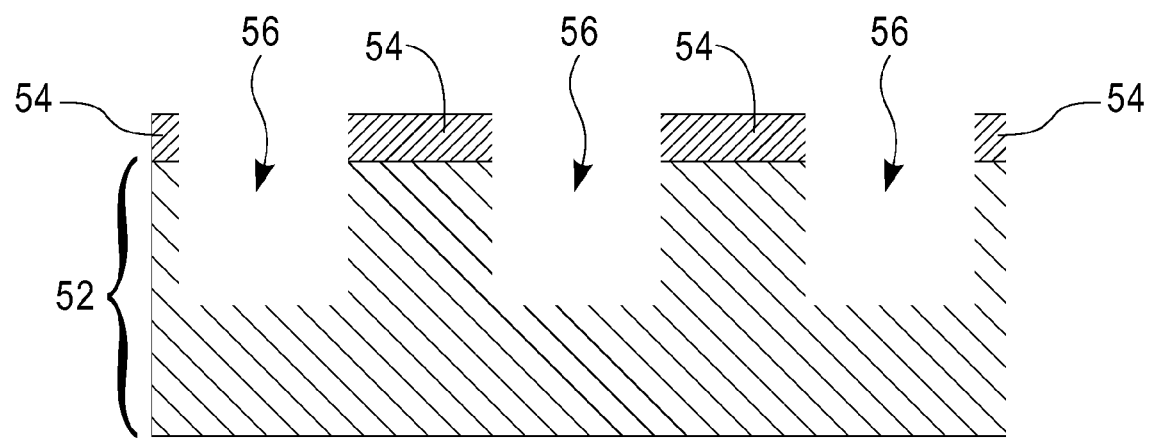

Reference is now made to FIGS. 4A-4E which are pictorial representations (through cross sectional views) illustrating one exemplary interconnect structure of the present invention through various processing steps. In the particular embodiment of the invention, an interconnect structure with a noble metal cap is provided in which the low k dielectric material has a non-recessed upper surface. Specifically, FIG. 4A illustrates an initial structure 50 that can be employed in the present invention in fabricating an interconnect structure in accordance with the invention. The initial structure 50 includes a dielectric material 52 having a pad stack 54 located on an upper surface thereof.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 3.0 or less, with a dielectric constant of about 2.8 or less being even more typical. All dielectric constants mentioned herein are relative to a vacuum, unless otherwise noted. These dielectrics, which may be referred to herein as a low k dielectric material, generally have a lower parasitic cross talk as compared with dielectric materials that have a higher dielectric constant than 4.0. The thickness of the dielectric material 52 may vary depending upon the dielectric material used as well as the exact number of dielectric layers within the dielectric material 52. Typically, and for normal interconnect structures, the dielectric material 52 has a thickness from about 50 to about 1000 nm.

The dielectric material 52 is formed utilizing any conventional deposition process including, but not limited to chemical vapor deposition (CVD), plasma enhanced chemical vapor deposition (PECVD), evaporation, chemical solution deposition and spin-on coating.

After forming the dielectric material 52, pad stack 54 is formed on an exposed upper surface of dielectric material 52. The pad stack 54 comprises an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition. In other embodiments, the pad stack 54 is formed by a thermal process such as, for example, thermal oxidation, thermal nitridation and/or thermal oxynitridation. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from about 10 to about 80 nm.

After forming the initial structure 50 shown in FIG. 4A, at least one opening 56 is formed into the dielectric material 52 utilizing the pad stack 54 as a pattern mask. The resultant structure including the at least one opening 56 is shown, for example, in FIG. 4B. The at least one opening 56 may include a via opening, a line opening, a combined via and line opening, or any combinations thereof. In the drawings, three openings are shown by way of a non-limiting example.

The at least one opening 56 is formed utilizing conventional lithography and etching. The lithographic step includes forming a photoresist (organic, inorganic or hybrid) atop the pad stack 54 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into first the pad stack 54 and then the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof. Typically, reactive ion etching is used to form the at least one opening 56.

Figure 4C:
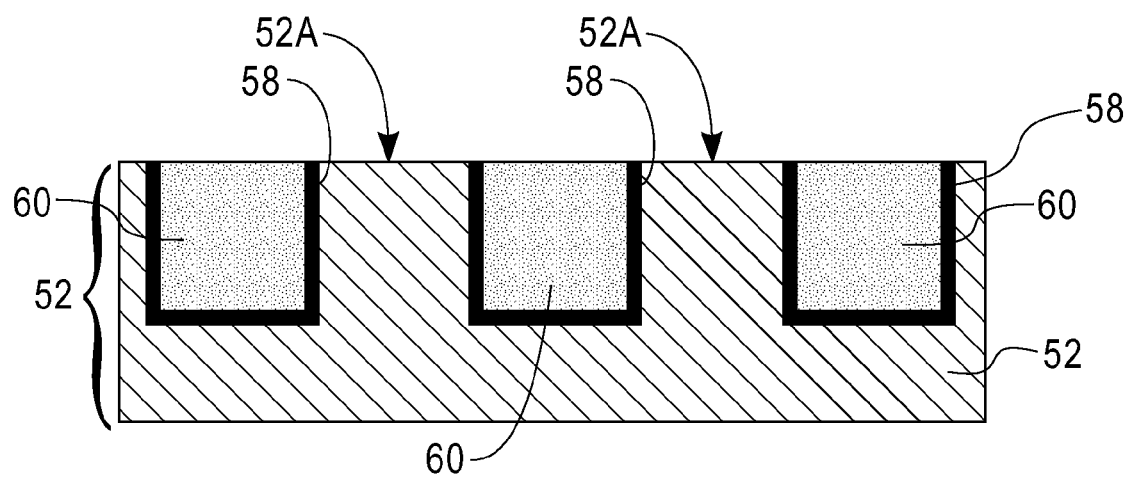

Next, and as shown in FIG. 4C, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from about 4 to about 40 nm, with a thickness from about 7 to about 20 nm being more typical.

The diffusion barrier 58, which is located between the conductive material 60 and the dielectric material 52 is formed by any conventional deposition process including, for example, atomic layer deposition (ALD), plasma enhanced atomic layer deposition (PEALD), CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 4C in which the upper surfaces of the dielectric material 52, the diffusion barrier 58 and the conductive material 60 are substantially coplanar with each other. It is observed that during the planarization process, the remaining pad stack 54 is removed from the structure.

It is further observed that the planarized upper surface of the dielectric material 52 is damaged during planarization. In FIG. 4C, the damaged planarized upper surface of the dielectric material is denoted by reference numeral 52A. When the dielectric material 52 comprises a C-containing dielectric, the damaged planarized surface is C depleted as compared to the remaining bulk dielectric material 52. When the dielectric material 52 comprising a non C-containing dielectric material 52, the damaged planarized surface has a greater porosity as compared to the remaining bulk dielectric material 52.

The damaged surface 52A also typical includes pendant silanol (i.e., Si—OH) groups which have a high affinity for moisture uptake. That is, the damaged surface 52A of the dielectric material 52 is more hydrophilic than the remaining portion of the dielectric material. As such, the damaged surface 52A typically has a higher dielectric constant than the bulk material.

At this point of the present invention, the damaged planarized upper surface 52A of the dielectric is treated with a silylating agent which is capable of converting the pendant silanol groups on the damaged surface of the dielectric material to a different functional group resulting in a recovery (i.e., restoration) of the hydrophobicity of the damaged dielectric material and reduction of the dielectric constant from its damaged state.

In one embodiment of the invention, the silylating agent is a silane having the structure $(R_1)(R_2)(R_3)SiNH(R_4)$ wherein $R_1$, $R_2$, $R_3$ are the same or independently selected from the group of H, alkyl (such as methyl, ethyl, propyl, etc.), aryl, phenyl, and/or derivatives thereof as well as a halogen (e.g., Cl, Br, F, I) and $R_4$ is $SiR_1$; $R_2$; $R_3$ in addition to being independently selected from the group H, alkyl, aryl, propyl, phenyl, and or derivatives thereof. In an alternate embodiment, the silylating agent comprises a tetravalent organosilicon compound, wherein the silicon atom is coordinated to 4 ligands in the positions 1, 2, 3 and 4 in a pyramidal configuration. In yet another embodiment, the silylating agent comprises a silazane structure, which can be described as an amine structure with two organosilyl groups coordinated to the nitrogen of the amine.

In yet another embodiment of the invention, the silylating agent comprises one of $R_xSiCl_y$, $R_xSi(OR')_y$, $R_xSi(OCOR')_y$, $R_xSiH_y$, and long chain mono, di or tri halosilanes or alkoxy silanes such as, for example, 11-bromo-undecyltrichlorosilane, 11-cyan-undecyltrimethoxysilane and docosenyltriethoxysilane. In the above formula, R and R' are the same or different and are alkyls containing from 1 to about 16 C atoms of aryls containing from 4 to 12 C atoms, x is from 1 to 3 and y is from 1 to 3.

Examples of silylating agents that can be used in the present invention include, but not limited to silyl amine, hexamethyldisilazane (HMDS), chlorotrimethylsilane (TMCS), trichloromethylsilane (TCMS), 3-aminopropyl-1-trimethoxy silane, 3-aminopropyl-1-trimethyl silane, trimethylsilyldiethylamine, N,O-bis(trimethylsilyl)sulfamate, isopropyldimethylsilyl ether, t-butyldimethylsilyl chloride, (triphenylmethyl)dimethyl silyl bromide and methyldiisopropylsilyl chloride. A highly preferred silylating agents employed in this invention is HMDS.

The silyating agent may be introduced to the damaged surface 52A of the dielectric material 52 in the form of liquid, gas, or in a supercritical state. In a preferred embodiment, the silylating agent is introduced to the damaged surface 52A of the dielectric material in the form of a vapor phase, a solution phase or by a supercritical carbon dioxide process. The silylation may or may not be followed by post treatment, e.g., thermal, UV, or other treatments to enhance silylation. For example, thermal pos treatment may aid in removing volatile by-products. Notwithstanding which form is used, this surface treatment with the silylating agent occurs selectively on the dielectric material due to the presence of the pendant silanol groups.

It is noted that the silylation agent typically stays in the structure and provides a hydrophobic surface 52B on the dielectric material 52 which aids in the selective deposition of the noble metal cap 62 on the conductive material 60. It is further noted that the hydrophobic surface 52B may extend into the bulk dielectric material 52 to a depth of from about 1 to about 10 nm.

Figure 4D:
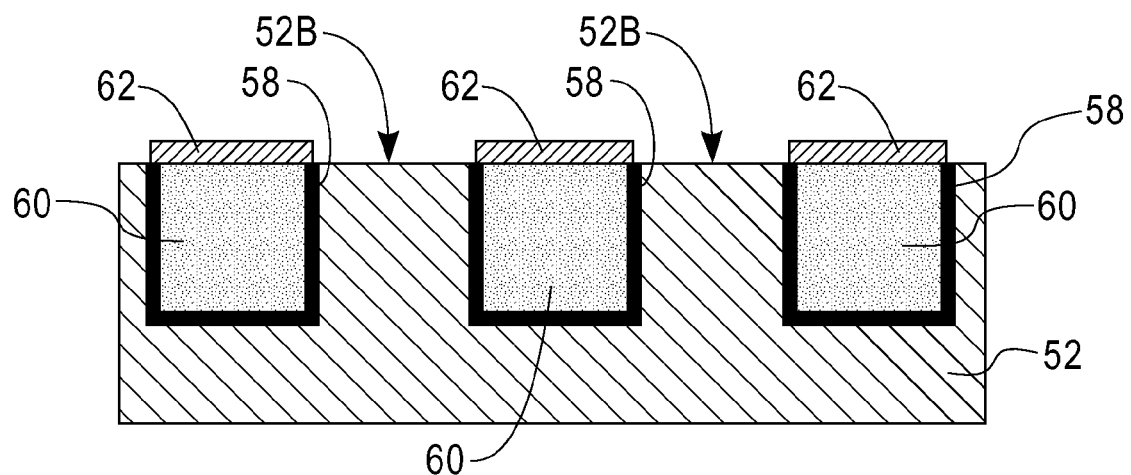
Figure 4E:
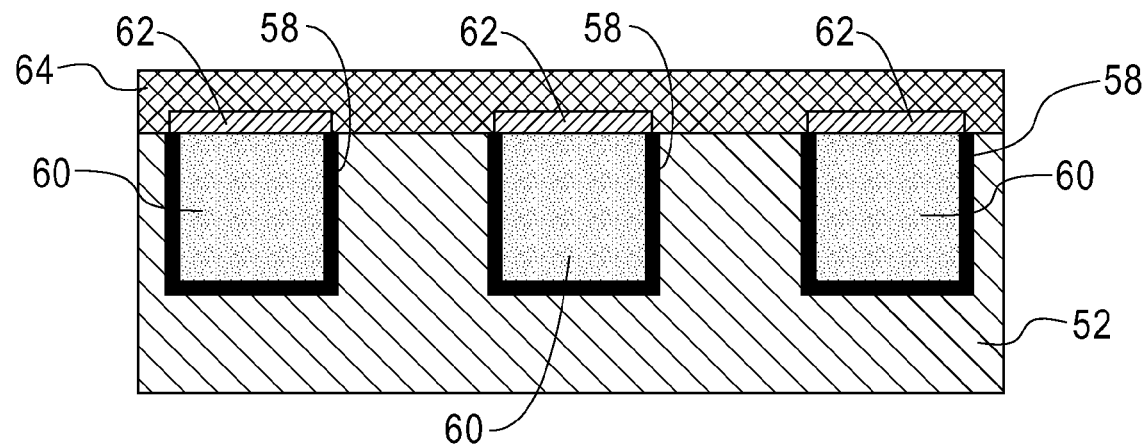

Next, and as is also shown in FIG. 4D, a noble metal cap 62 is selectively formed atop the conductive material 60; some of the noble metal cap 62 may extend onto the surface of the diffusion barrier 58, but little or none of the noble metal cap 62 (or residues thereof) extends onto the hydrophobic surface 52B of the dielectric material 52 that is laterally adjacent to the conductive material 60.

The term "noble metal" when referring to the metallic cap located atop the at least one conductive region (i.e., conductive material 60) includes any metal that is resistant to corrosion or oxidation. The preferred noble metals that can be used in the present invention as the noble metal cap 62 are selected from the group consisting of Ru, Ir, Rh, Pt and alloys thereof. More preferably, the noble metal employed as the noble metal cap 62 comprises Ru or a Ru alloy. In some embodiments, the noble metal cap 62 is comprised of a multilayered noble metal or noble metal alloy stack.

The thickness of the noble metal cap 62 may vary depending on the type of noble metal present in the cap, the deposition technique and conditions used as well as the number of noble metals within the cap. Typically, the noble metal cap 62 has a thickness from about 1 to about 100 Å, with a thickness from about 5 to about 50 Å being more highly preferred.

The noble metal cap 62 is formed utilizing a low temperature deposition process including, for example, CVD, PECVD, low pressure CVD and ALD. By "low temperature", it is meant a deposition temperature of about 300° C. or less, with a deposition temperature between 150° C. and 250° C. being even more preferred.

After selectively forming the noble metal cap 62 onto conductive material 60, a dielectric capping layer 64 is formed across the entire structure shown in FIG. 4D. The resultant structure including the dielectric capping layer 64 is shown, for example, in FIG. 4E. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof.

The thickness of the dielectric capping layer 64 may vary depending on the technique used to form the same as well as the material make-up of the layer. Typically, the dielectric capping layer 64 has a thickness from about 15 to about 100 nm, with a thickness from about 25 to about 45 nm being more typical.

The dielectric capping layer 64 is formed utilizing any conventional deposition process including, for example, CVD, PECVD, evaporation, spin-on coating, chemical solution deposition and PVD.

In a second embodiment of the present invention, an interconnect structure with a noble metal cap and a recessed low k dielectric material is provided. By "recessed", it is meant that the dielectric material has an upper surface that is located beneath the upper surface of the conductive material 60 embedded within the dielectric material. The recessing occurs after formation of the noble metal on the surface of the conductive material 60. The silylating surface treatment mentioned above is employed to convert the pendant silanol groups of the damaged surface to a different functional group resulting in a recovery (i.e., restoration) of the hydrophobicity of the damaged dielectric material and reduction of the dielectric constant from its damaged state. After such treatment, the noble metal cap is formed and then a recessing step is employed. This embodiment is now discussed in greater detail.

The second embodiment of the invention begins by first providing the structure shown in FIG. 4D. After providing the structure shown in FIG. 4D, the structure is subjected to an etching process that etches the dielectric material selective to the noble metal cap and diffusion barrier layer. The selective etch used to recess the dielectric material comprises a chemical wet etching process in which an inorganic acid such as dilute HF, HCl, $H_2SO_4$, or $HNO_3$ is employed. Combinations of the aforementioned inorganic acids are also contemplated.

As stated above, this selective chemical etching step recesses the dielectric material such that the etched dielectric material has an etched upper surface that is located below that of the conductive material 60. As such, the etched dielectric surface is no longer co-planar with the upper surface of the conductive material 60. The depth of the recess may vary and is not critical to the present invention. Typically, the depth of the recess, as measured from the upper surface of the conductive material 60, to the etched upper surface 52C of the dielectric material 52, is from about 1 to about 10 nm, with a depth from about 2 to about 5 nm. The extent of the recess depth is a function of the conditions, i.e., acid strength and contact time, of the selective chemical etching step employed. It is observed that this selective chemical etching step may remove some, or all portions of the previously formed hydrophobic surface. In a preferred embodiment, the recessed dielectric surface 52C still contains a silyating agent therein.

Figure 5A:
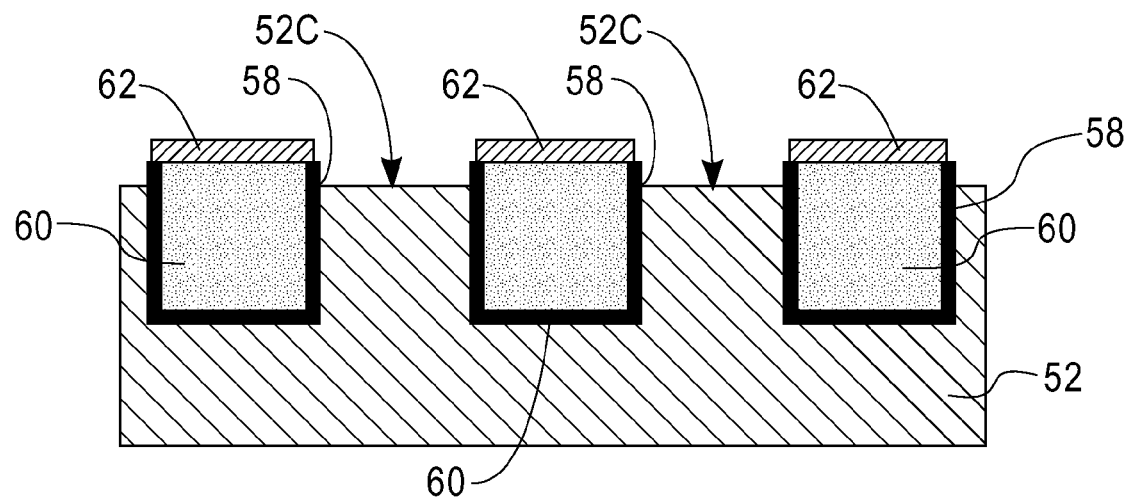
FIGS. 5A-5B illustrate an interconnect structure (through cross sectional views) with a noble metal cap and a recessed upper surface of a low k dielectric material during various processing steps of another embodiment of the present invention.
Figure 5B:
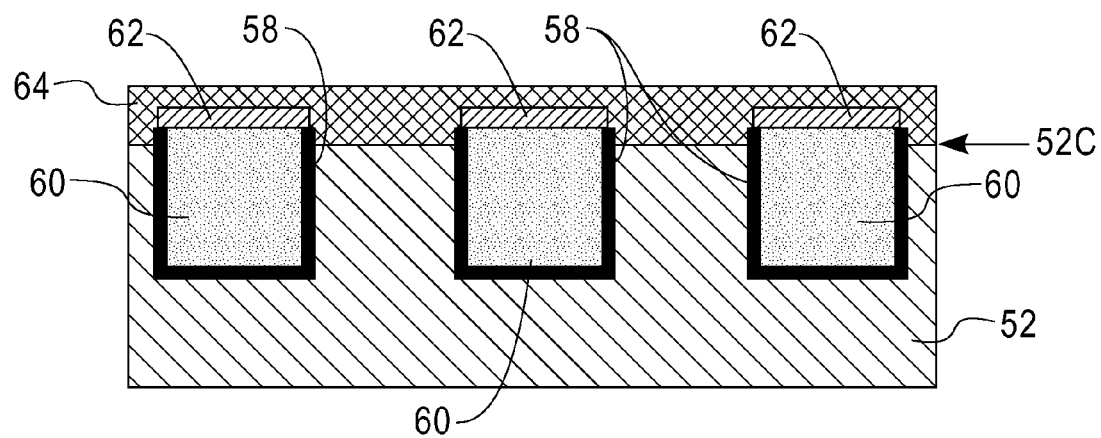

After recessing the dielectric material, a dielectric capping layer 64 (as described above) is formed across the entire structure shown in FIG. 5A to provide the resultant structure shown, for example, in FIG. 5B.

It is observed that the above two embodiments describe instances in which a silyating agent is used to provide a hydrophobic surface on the interconnect structure which aids in the selective formation of the noble metal cap onto the surface of the conductive material.

In yet another embodiment of the invention, a hydrophobic polymeric layer such as a polysiloxane is selectively formed on the exposed surfaces of the dielectric material. After the selective formation of the hydrophobic polymeric layer onto the dielectric material, a noble metal cap is either selectively formed on the conductive material utilizing the hydrophobic polymeric layer to enhance the selectivity of the noble metal cap onto the surface of the conductive material, FIGS. 6A-6B, or non-selectively formed on both the exposed conductive and dielectric materials, FIGS. 7A-7B. In the embodiments which are shown in FIGS. 6A-6B and FIGS. 7A-7B, the structures include a noble metal cap having an upper surface that is substantially planar with the hydrophobic polymeric layer.

Figure 6A:
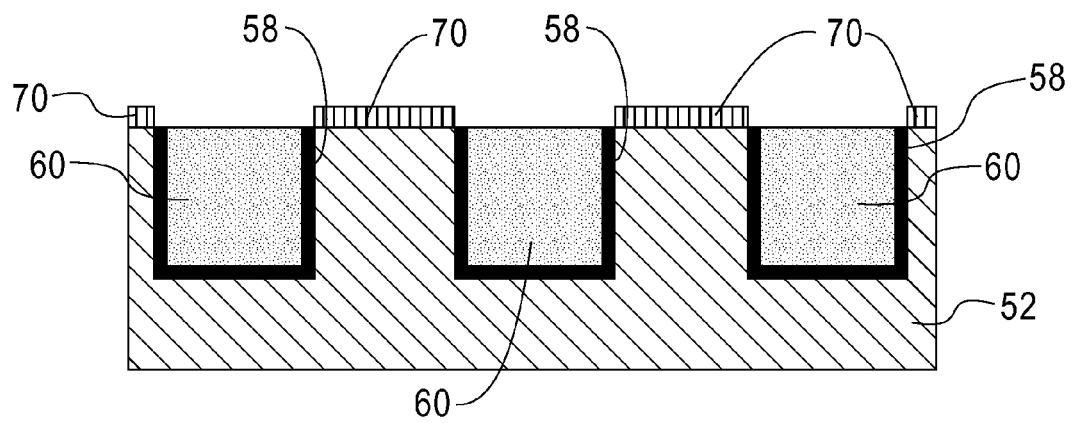
FIGS. 6A-6B illustrate an interconnect structure (through cross sectional views) with a noble metal cap and a layer of a polysiloxane disposed on an upper surface of a low k dielectric material during various processing steps of yet another embodiment of the present invention.
Figure 6B:
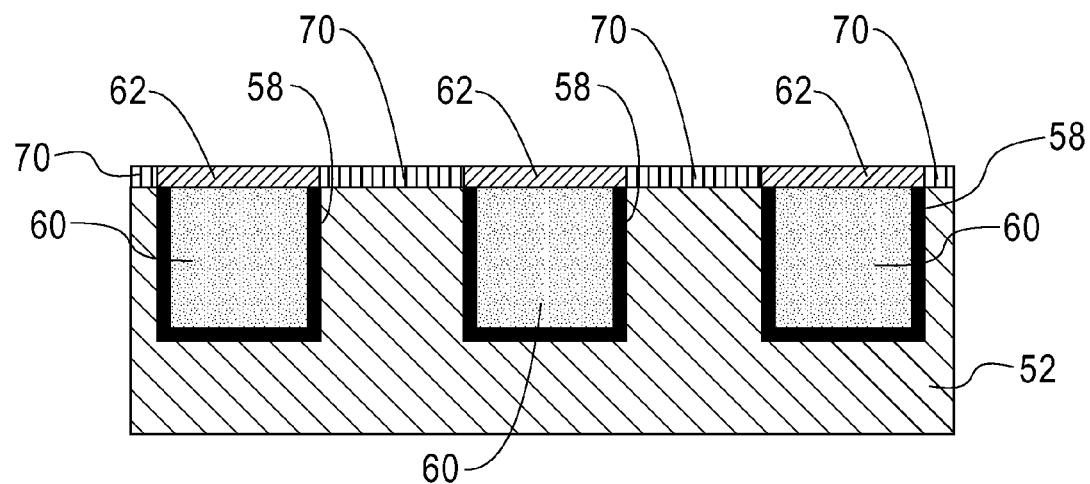

Reference is first made to FIGS. 6A-6B which illustrate one embodiment of the invention in which a hydrophobic polymeric layer is selectively formed on a planarized and damaged surface of a dielectric material. This particular embodiment of the invention begins by first providing the structure shown in FIG. 4C. After providing the structure shown in FIG. 4C, a hydrophobic polymeric layer 70 is selectively formed on the exposed upper surface of the dielectric material 52. The resultant structure including the hydrophobic polymeric layer 70 is shown, for example, in FIG. 6A. It is noted that the exposed upper surface of the dielectric material is a damaged surface 52A.

The hydrophobic polymer is formed utilizing any deposition process which can selectively form the polymer layer on the surface of the dielectric material. Suitable selective deposition processes include, for example, spin-on coating and CVD. In one embodiment of the invention, the as-deposited polymer layer is uncured. In another embodiment, the as-deposited polymer is cured after deposition utilizing a conventional curing process including, for example, UV curing or thermal curing. The thickness of the as-deposited polymer layer may vary depending on the conditions of the selective deposition process employed. Typically, and by way of an example, the as-deposited polymeric layer has a thickness from about 1 to about 20 nm, with a thickness from about 5 to about 10 nm being even more typical.

The hydrophobic polymeric layer typically includes atoms of Si, C and H and has a dielectric constant that is equal to, or less than, the dielectric constant of dielectric material. Examples of suitable polymers that are hydrophobic after deposition include, for example, polysiloxane, polysilsesquioxane and multilayers thereof. In one preferred embodiment of the invention, the hydrophobic polymer comprises a polysiloxane.

FIG. 6B illustrates the structure that is formed after selectively depositing a noble metal cap 62 on the surface of conductive material 60. A complete description of the noble metal cap and the method for selectively depositing the same on the surface of the conductive material is found above.

Figure 7A:
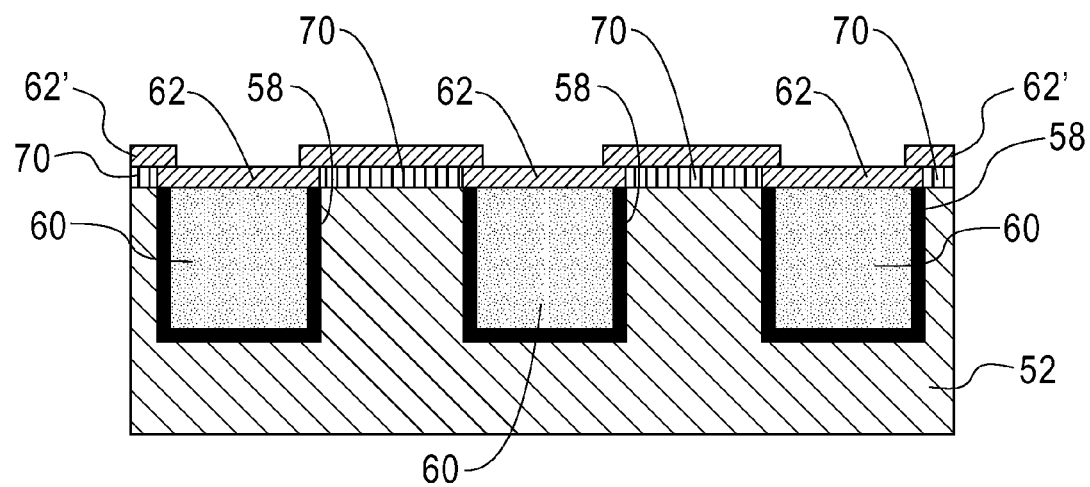
FIGS. 7A-7B illustrate an interconnect structure (through cross sectional views) with a noble metal cap and a layer of a polysiloxane disposed on an upper surface of a low k dielectric material during various processing steps of an even further embodiment of the present invention.
Figure 7B:
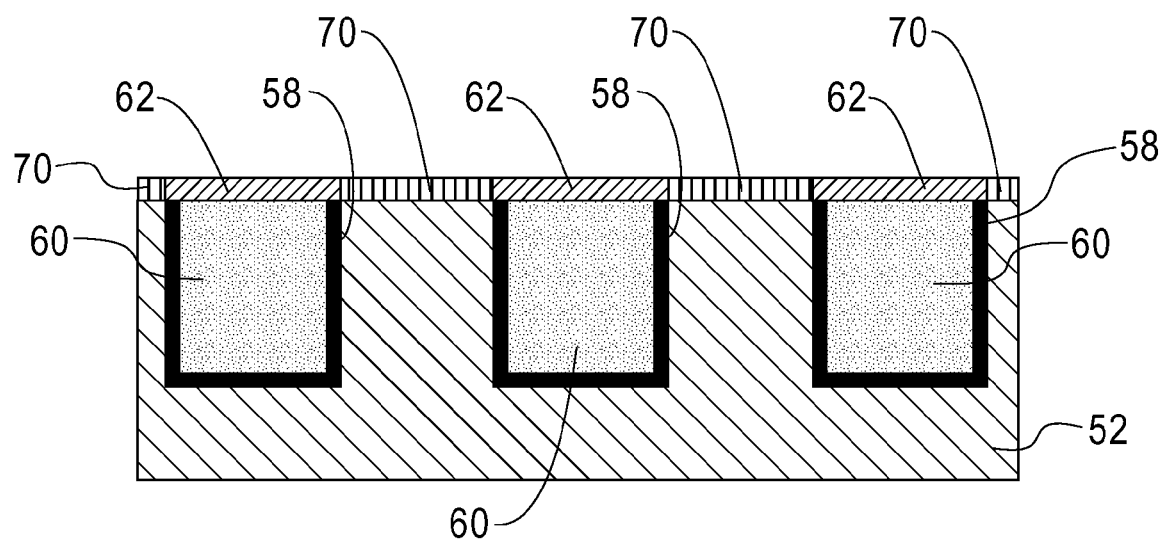

Reference is now made to FIGS. 7A-7B which illustrate another embodiment of selectively forming a hydrophobic polymeric layer 70 on the surface of the dielectric material 52. This embodiment of the invention begins by first providing the structure shown in FIG. 6A. After selectively forming the polymer layer 70 on the surface of the dielectric material 52, a blanket layer 62' of a noble metal material is formed on the entire surface of the structure providing the structure shown, for example, in FIG. 7A. The blanket layer of noble metal material 62' is formed utilizing physical vapor deposition (PVD), chemical vapor deposition, plasma enhanced chemical vapor deposition or any other non-selectively deposition process. The thickness of the blanket layer of noble metal material 62' that is deposited is within the range of the noble metal cap 62 described above.

Next, a recessing process is performed which removes the noble metal material 62' located above the hydrophobic polymeric layer 70 providing the structure shown in FIG. 7B. The recessing step includes chemical mechanical planarization and/or grinding. Alternatively, the recessing process includes a chemical etching.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:

a dielectric material having a dielectric constant of about 3.0 or less, said dielectric material having an upper hydrophobic surface and at least one conductive material having an upper surface embedded within said dielectric material, wherein said upper hydrophobic surface comprises a silylating agent which caps off silanol functional groups present on the dielectric material and wherein said upper hydrophobic surface is recessed relative to the upper surface of said at least one conductive material; and a noble metal cap located directly on said upper surface of said at least one conductive material, said noble metal cap does not substantially extend onto said upper hydrophobic surface and no noble metal residues are present on the hydrophobic surface.

2. The interconnect structure of claim 1 wherein said noble metal cap is selected from the group consisting of Ru, Ir, Rh, Pt and alloys thereof.

3. The interconnect structure of claim 2 wherein said noble metal cap comprises Ru or a Ru alloy.

4. The interconnect structure of claim 1 further comprising a dielectric capping layer located atop said dielectric material and said noble metal cap.

5. An interconnect structure comprising:

a dielectric material having a dielectric constant of about 3.0 or less, said dielectric material having a hydrophobic polymer layer including atoms of Si, C and H disposed thereon and at least one conductive material having an upper surface embedded within said dielectric material; and a noble metal cap located directly on said upper surface of said at least one conductive material, said noble metal cap does not substantially extend onto said hydrophobic polymer layer and no noble metal residues are present on the hydrophobic polymer layer.

6. The interconnect structure of claim 5 wherein said noble metal cap is selected from the group consisting of Ru, Ir, Rh, Pt and alloys thereof.

7. The interconnect structure of claim 6 wherein said noble metal cap comprises Ru or a Ru alloy.

8. The interconnect structure of claim 5 further comprising a dielectric capping layer located atop said dielectric material and said noble metal cap.

9. The interconnect structure of claim 5 wherein said hydrophobic polymer layer has an upper surface that is coplanar with an upper surface of said at least one conductive material.

* * * * *